United States Patent [19]

Tanizawa

[11] Patent Number: 4,751,410

[45] Date of Patent: Jun. 14, 1988

[54] COMPLEMENTARY BI-MIS GATE CIRCUIT

[75] Inventor: Tetsu Tanizawa, Kawasaki, Japan

[73] Assignee: Fujitsu Limited, Kawasaki, Japan

[21] Appl. No.: 746,625

[22] Filed: Jun. 19, 1985

[30] Foreign Application Priority Data

Jun. 25, 1984 [JP] Japan ................... 59-130438
Sep. 21, 1984 [JP] Japan ................... 59-198811

[51] Int. Cl.$^4$ .................. H03K 17/687; H03K 19/094
[52] U.S. Cl. ................... 307/570; 307/572; 307/574; 307/451; 307/576
[58] Field of Search ........... 307/570, 574, 576, 451, 307/453, 300, 572

[56] References Cited

U.S. PATENT DOCUMENTS

| | | | |
|---|---|---|---|
| 3,879,619 | 4/1975 | Pleshko | 307/570 |
| 4,329,600 | 5/1982 | Stewart | 307/473 |
| 4,347,445 | 8/1982 | Baker | 307/574 |

FOREIGN PATENT DOCUMENTS 0062239  4/1985  Japan ................... 307/473

OTHER PUBLICATIONS

Translation of Japanese Pat. No. 60-62239.
Patent Abstracts of Japan, vol. 4, No. 79, Jun. 7, 1980, p. 9 E 14.
Patent Abstracts of Japan, vol. 8, No. 103, May 15, 1984.
Patent Abstracts of Japan, vol. 3, No. 54, May 10, 1979, p. 28 E 109.
Patent Abstracts of Japan, vol. 2, No. 120, Oct. 6, 1978, p. 6968 E 78.

Primary Examiner—Stanley D. Miller
Assistant Examiner—B. P. Davis
Attorney, Agent, or Firm—Staas & Halsey

[57] ABSTRACT

A complementary Bi-MIS gate circuit including two CMIS circuits each having a PMIS transistor connected to a high potential source, an NMIS transistor connected to a low potential source, and an impedance element connected between the PMIS and NMIS transistors, and a load driving inverter having a vertically structured pull-up bipolar transistor and a vertically structured pull-down bipolar transistor connected in series. The base terminals of the pull-up and pull-down bipolar transistors are connected to a high voltage level end of the impedance element in one CMIS circuit and to a low voltage level end of the impedance element in the other CMIS circuit respectively. The input signal for the gate circuit is fed to the gate terminals of all the PMIS and NMIS transistors and the output signal of the gate circuit is produced at a connection point between the pull-up and pull-down bipolar transistors. The impedance element in each CMIS circuit works to reduce or remove surge currents which flow through the CMIS circuit when the input signal changes level from low to high or from high to low levels. The Bi-MIS circuit also includes transistors connected in the current paths of the circuit when the circuit is in a high impedance state which cuts off current flow during the high impedance state.

6 Claims, 4 Drawing Sheets

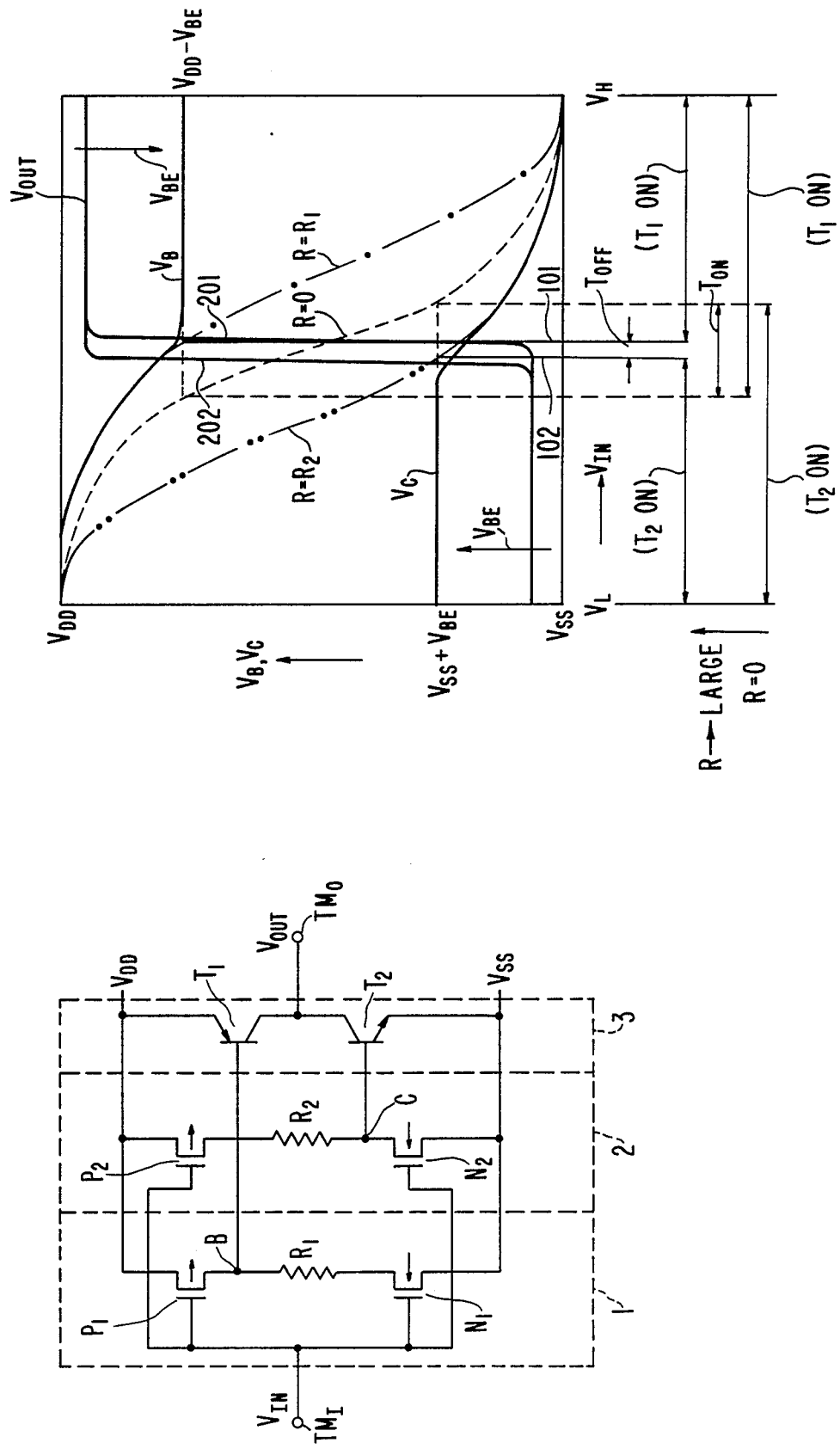

COMPLEMENTARY BI-MIS GATE CIRCUIT

BACKGROUND OF THE INVENTION

The present invention relates to a complementary Bi-Mis (a bipolar semiconductor device combined with a metal insulator semiconductor device) gate circuit which includes a CMIS (complementary metal insulator semiconductor) circuits and a load driving inverter; the CMIS circuit comprising a PMIS (P type MIS) transistor and an NMIS (N type MIS) transistor and the load driving inverter comprising a pull-up transistor and a pull-down transistor are connected in series.

Each CMIS circuit is controlled so that a surge or short-circuit current (a first surge current) which flows through the CMIS circuit is reduced. The load driving inverter is also controlled so that a surge current (a second surge current) which flows through the driving inverter is removed. The first and second surge currents flow from a high potential source to a low potential source because respective transistors in the CMIS circuit and the driving inverter are simultaneously ON during a transient time in which an input signal applied to the gate circuit changes its level from low to high or from high to low.

Furthermore, the complementary Bi-MIS gate circuit is controlled so that a leakage current which flows in the gate circuit is stopped. The leakage current flows when the gate circuit is used as a 3-state circuit and is operating in a high impedance state.

The CMIS circuit is widely used as a logic semiconductor integrated circuit because the CMIS circuit has almost zero power consumption when in a steady state, a wide supply voltage range, a high input impedance and a low output impedance. A MOS (metal oxide semiconductor) transistor such as a PMOS (P type MOS) transistor or an NMOS (N type MOS) is a typical MIS transistor, so for convenience of explanation, a CMOS circuit and a Bi-MOS gate circuit will be discussed hereinafter.

The MOS transistor is a surface conductive type device having a lateral structure, and it is hard to drive very much current through a MOS transistor compared with a vertically structured semiconductor device like a bipolar transistor. Therefore, the complementary Bi-MOS gate circuit is usually composed of the CMOS circuits and a load driving inverter comprising a pull-up bipolar transistor and a pull-down bipolar transistor which are connected in series forming a totem pole type circuit. As a result, the high input impedance characteristic of the CMOS circuit and the low output impedance characteristic of the bipolar transistor are effectively utilized in the complementary Bi-MIS (Bi-MOS) gate circuit.

However, the complementary Bi-MOS gate circuit of the prior art has a problem in that first and second surge or short circuit currents flow in the gate circuit during a transient time when the transistors in the CMOS circuit and the load driving inverter are simultaneously ON. The surge currents produce noise which affects other circuits through a power source line, and increases the power dissipation and temperature of the complementary Bi-MOS gate circuit.

SUMMARY OF THE INVENTION

An object of the present invention is to suppress the surge or short circuit currents in a complementary Bi-MOS gate circuit; the first surge current produced in the CMOS circuit is reduced and the second surge current produced in the load driving inverter is removed.

Another object of the present invention is to reduce leakage current, which flows in the complementary Bi-MOS gate circuit when the gate curcuit is used as a 3-state circuit and operating in a high impedance state, to as little as zero.

An additional object of the present invention is to remove noise produced by a Bi-MOS gate circuit.

A further object of the present invention is to reduce power dissipation and temperature of a Bi-MOS gate circuit.

The above objects can be achieved by applying two CMOS circuits each having an impedance element between a PMOS transistor and an NMOS transistor which comprise the CMOS circuit. The connection between the CMOS circuits and the load driving inverter is made so that a high voltage level end of the impedance element in one CMOS circuit is connected to the base terminal of the pull-up bipolar transistor in the load driving inverter and a low voltage level end of the impedance element in the other CMOS circuit is connected to the base terminal of the pull-down bipolar transistor in the inverter.

After inserting the impedance element into a CMOS circuit, when the level of an input signal applied to the complementary Bi-MOS gate circuit changes from low to high or high to low, the first surge currents which occur in respective CMOS circuits can be reduced and the second surge current which occurs in the load driving inverter can be removed because the base voltage of the pull-up and pull-down bipolar transistors are controlled by the impedance elements so that both bipolar transistors are cut off.

The reduced leakage current can be achieved by adding PMOS and NMOS transistors and an inverter to the base circuits of the PNP and NPN transistors in the load driving inverter. These additional elements are controlled by an enable signal applied to the complementary Bi-MOS gate circuit to reduce a current which flows through the complementary Bi-MOS gate circuit to almost zero when the gate circuit is used as a 3-state circuit operating in a high impedance state.

Applying the present invention, the surge currents and the leakage current can be reduced, so that the noise, the rise in temperature, and the power dissipation which occur in the prior art complementary Bi-MOS gate circuit can be reduced by a simple improvement in the gate circuit.

These together with other objects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a complementary Bi-MOS gate circuit according to the present invention;

FIG. 4 is the transfer characteristic graph of the potential at a point B and a point C as affected by an input signal voltage of the complementary Bi-MOS gate circuit;

DETAILED DESCRIPTION OF THE INVENTION

Figure 2A:
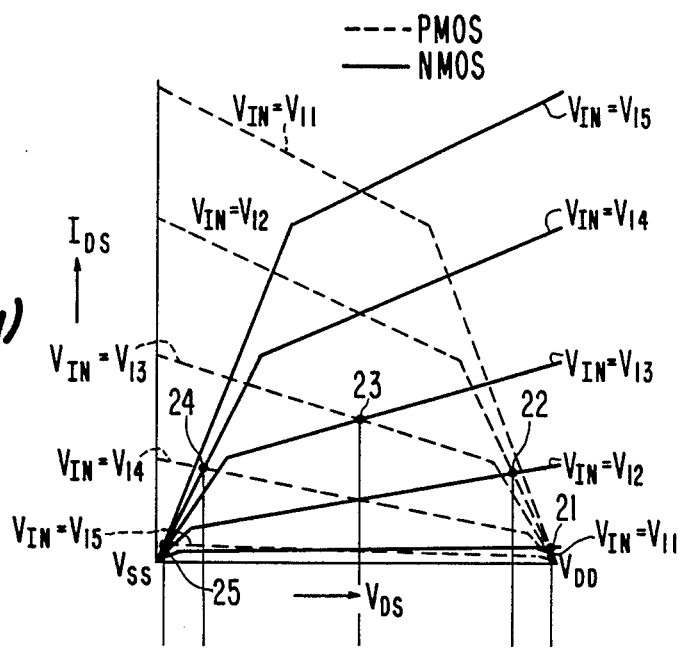
FIG. 2(a) is the $V_{DS}$–$I_{DS}$ characteristic graph of a PMOS transistor and an NMOS transistor used in a prior art CMOS circuit.

FIG. 1 illustrates a complementary Bi-MOS gate circuit according to the present invention. The complementary Bi-MOS gate circuit comprises two CMOS circuits (a first CMOS circuit 1 and a second CMOS circuit 2) and a load driving inverter 3. The first CMOS circuit 1 comprises a first PMOS transistor $P_1$, a first NMOS transistor $N_1$, and a first resistor $R_1$, and the second CMOS circuit 2 comprises a second PMOS transistor $P_2$, a second NMOS transistor $N_2$, and a second resistor $R_2$, the resistors $R_1$ and $R_2$ are used as an impedance element. The load driving inverter 3 comprises a P type junction transistor (PNP transistor) $T_1$ and an N type junction transistor (NPN transistor) $T_2$. Since there are many types of junction transistors each having a longitudinal structure, for example, a bipolar transistor (BPT) or a unipolar transistor which is well known as a punch through device like a static induction transistor (SIT) or a permeable base transistor (PBT), the BPT will be used in the discussion hereinafter.

Resistors $R_1$ and $R_2$ are connected between the drains of transistors $P_1$, $N_1$ and $P_2$, $N_2$ of the first 1 and second 2 CMOS circuits respectively, and a high voltage level end (a point B in FIG. 1) of resistor $R_1$ and a low voltage level end (a point C in FIG. 1) of resistor $R_2$ are connected to the bases of transistors $T_1$ and $T_2$ respectively. The gate terminals of respective MOS transistors of the first 1 and second 2 CMOS circuits are connected to an input terminal $TM_I$ of the complementary Bi-MOS gate circuit, and the collectors of transistors $T_1$ and $T_2$ are connected to an output terminal $TM_O$ of the gate circuit.

The operation of the complementary Bi-MOS gate circuit in FIG. 1 according to the present invention will be disclosed by discussing: (1) the $V_{DS}$-$I_{DS}$ characteristics (where $V_{DS}$ is the drain source voltage and $I_{DS}$ is a drain source current of a PMOS or an NMOS transistor) of a PMOS and an NMOS circuit, and an input-output voltage transfer characteristic of the conventional CMOS circuit, as shown in FIG. 2; (2) a $V_{DS}$-$I_{DS}$ characteristic and the input-output voltage transfer characteristic of a CMOS circuit having a resistor between the drain terminals of a PMOS and an NMOS transistor which both comprise the CMOS circuit, as shown in FIG. 3; and (3) the transient characteristics of $V_B$ and $V_C$ ($V_B$ is the potential at the point B, and $V_C$ is the potential at the point C) resulting from an input signal voltage $V_{IN}$ of the complementary Bi-MOS gate circuit, as shown in FIG. 4.

Figure 2B:
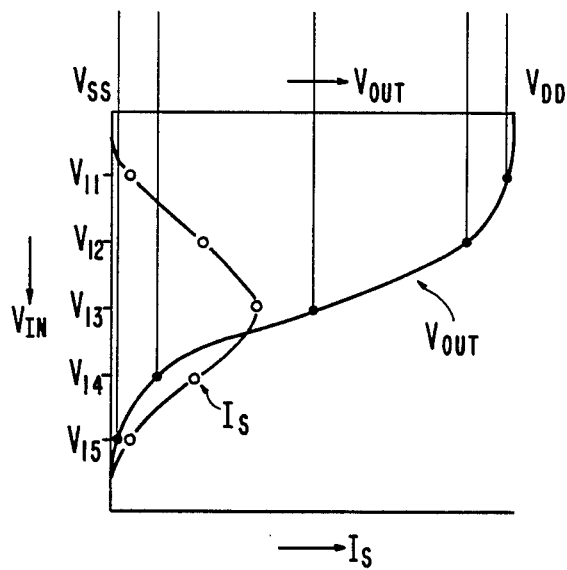
FIG. 2(b) is an input-output signal voltage transfer characteristic and a first surge current graph of the prior art CMOS circuit.
Figure 2C:
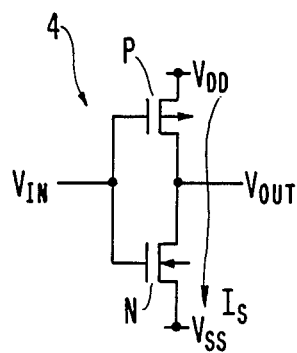
FIG. 2(c) is the prior art CMOS circuit.

FIG. 2(a) shows the $V_{DS}$-$I_{DS}$ characteristics of an NMOS transistor N and a PMOS transistor P in the conventional CMOS circuit 4 shown in FIG. 2(c). In FIG. 2(a), solid and dashed curves are for transistors N and P respectively, and the curves are determined by the parameter of the input signal voltage $V_{IN}$ applied to the CMOS circuit 4; reference symbols $V_{11}$-$V_{15}$ indicate $V_{IN}$ from low to high voltages.

FIG. 2(b) shows an input-output signal voltage ($V_{IN}$-$V_{OUT}$) transfer characteristic of the conventional CMOS circuit 4 and a first surge current $I_S$ which flows from high source voltage $V_{DD}$ to low source voltage $V_{SS}$ through transistors P and N when $V_{IN}$ is in the intermediate level between low and high. The $V_{IN}$-$V_{OUT}$ curve can be plotted by connecting the cross points of the $I_{DS}$ curves of transistors P and N both having the same parameters; the points 21–25 are the cross points in FIG. 2(a), and the $I_S$ curve can be plotted by connecting the points 21–25. Since $V_{OUT}$ is provided by transistors N and P which divide the potential difference between $V_{DD}$ and $V_{SS}$, $I_{DS}$ of transistor P is greater than that of transistor N when the level of $V_{IN}$ is low, $I_{DS}$ of transistor N begins to flow more with the increase of $V_{IN}$ level, and finally $I_{DS}$ of transistor N exceeds that of transistor P when the $V_{IN}$ level is changed to high. During the above transition time, $V_{OUT}$ changes its level from high to low and $I_S$ changes passing through its maximum. When the $V_{IN}$ level changes from high to low, $V_{OUT}$ changes its level from low to high along a similar $V_{IN}$-$V_{OUT}$ curve to that in FIG. 2(b), and $I_S$ also reaches its maximum value similar to that in FIG. 2(b).

Figure 3A:
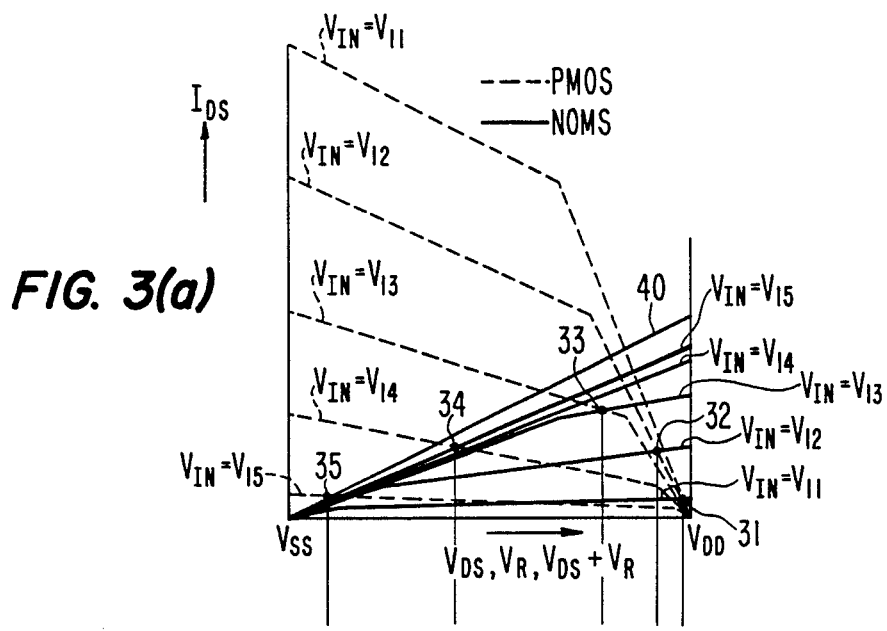
FIG. 3(a) is the $V_{DS}$-$I_{DS}$ characteristic graph of a PMOS transistor and an NMOS transistor, including a voltage drop characteristic of a resistor R in a CMOS circuit.
Figure 3B:
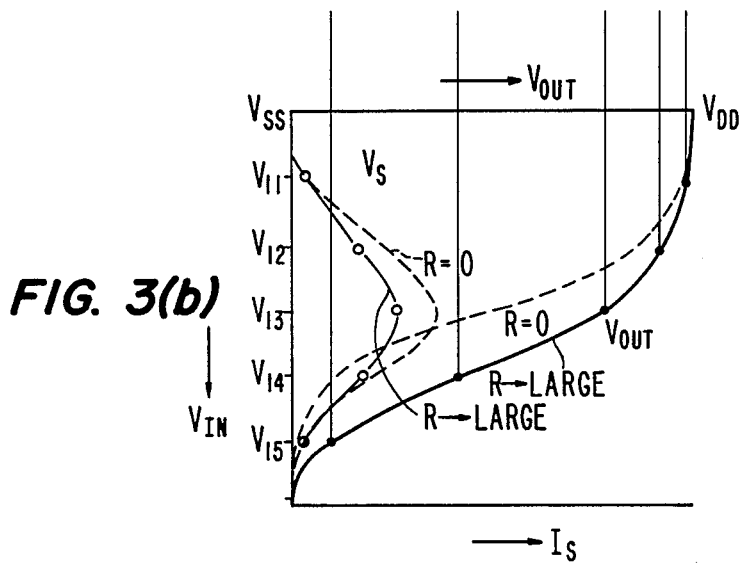
FIG. 3(b) is an input-output signal voltage transfer characteristic and a first surge current graph of the CMOS circuit having the resistor R.
Figure 3C:
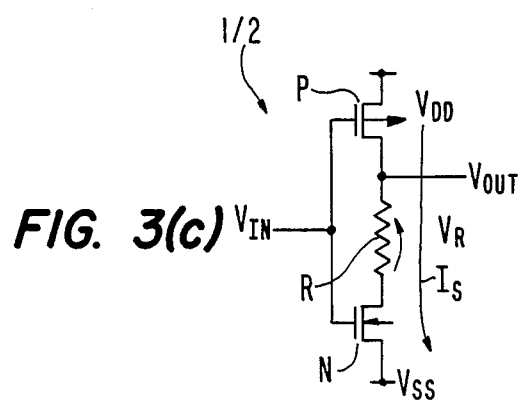
FIG. 3(c) is the CMOS circuit having the resistor R, the CMOS circuit being a part of the complementary Bi-MOS circuit according to the present invention.

In the present invention, an impedance element is inserted between a PMOS transistor P and an NMOS transistor N. FIG. 3(c) illustrates a part of the present invention (1 and 2) to allow discussion of the effect of inserting the impedance element. A resistor R is used as the impedance element and is inserted between the drain terminals of transistors P and N in the CMOS circuit 1/2 and $V_{OUT}$ is output from the high voltage level end of resistor R. In FIG. 3(a), dotted curves show the $V_{DS}$-$I_{DS}$ characteristic of transistor P and solid curves show that of transistor N including the voltage drop produced by resistor R and $I_{DS}$ which flows through resistor R and transistor N. FIG. 3(b) shows a $V_{IN}$-$V_{OUT}$ transfer characteristic and a first surge current $I_S$ which flows in the CMOS circuit 1/2.

In FIGS. 3(a) and 3(b), the reference numerals and symbols which are the same as those in FIGS. 2(a) and 2(b) designate the same elements. Reference symbol VR shown in FIGS. 3(a) and 3(c) indicates the voltage drop across resistor R, a solid line 40 in FIG. 3(a) shows the characteristic of the voltage drop. The axis of the abscissa indicates $V_R$, $V_{DS}$ for the $V_{DS}$-$I_{DS}$ curves of transistor P, and $V_{DS}+V_R$ for the $V_{DS}$-$I_{DS}$ curves of transistor N including $V_R$; $V_{DS}$ and $V_R$ have the same scale as each other on the axis. As shown in FIG. 3(a), the solid curves are shifted toward $V_{DD}$ as compared with the $V_{DS}$-$I_{DS}$ curves in FIG. 2(a), because when the $I_{DS}$ of transistor N flows through resistor R, the actual $V_{DS}$ applied to transistor N is what is obtained by subtracting $V_R$ from the voltage ($V_{DS}+V_R$) which is applied to resistor R and transistor N ($V_R$ can be obtained from the line 40), so the solid curves are shifted toward $V_{DD}$. Therefore, as shown in FIG. 3(b), $V_{OUT}$ is shifted so that its level is always higher than the $V_{OUT}$ level produced by the prior art CMOS circuit 4, shown in FIG. 2, during the transient time in which $V_{IN}$ is changing its voltage level from low to high or from high to low. The shift amount of $V_{OUT}$ depends on the resistance of resistor R; a dotted curve (R=0) in FIG. 3(c) shows $V_{OUT}$ of the prior art CMOS circuit 4. The first surge current $I_S$ which flows through resistor R and transistor N during the transient time can be obtained from FIG. 3(a) as shown in FIG. 3(b). The $I_S$ curve has a maximum amount during the transient time and is shifted so as to be decreased with the increase in the resistance of resistor R.

In contrast, if $V_{OUT}$ is output from the low voltage level end of resistor R during the transient time, the $V_{OUT}$ curve is shifted toward $V_{SS}$ from the $V_{OUT}$ curve (R=0) produced by the prior art CMOS circuit and $I_S$ is also shifted so as to decrease similar to the $I_S$ curve in FIG. 3(b).

FIG. 4 shows a voltage transfer characteristic of the circuit of the present invention shown in FIG. 1. The potential $V_B$ at a point B at a high level end of resistor $R_1$ is provided by combining a transfer characteristic of $V_{OUT}$, such as shown in FIG. 3(b), and an input clamping characteristic of the PNP transistor $T_1$. As shown by $V_B$ curve (thick solid curve) in FIG. 4, when $V_{IN}$ increases from its low voltage level $V_L$ to a high level $V_H$, $V_B$ tends to change along a one-dot chained curve (R=$R_1$) which is the appropriate curve when there is a CMOS circuit comprising transistor $P_1$, $N_1$, and resistor $R_1$ as shown in FIG. 3(c). However, $V_B$ in the circuit cannot fall below the base-emitter voltage $V_{BE}$ of $T_1$ because $V_B$ is clamped at a level of ($V_{DD}-V_{BE}$). The potential $V_C$ at a point C at the low voltage level end of resistor $R_2$ in FIG. 1 is provided by combining a transfer characteristic of $V_{OUT}$ and an input clamping characteristic of NPN transistor $T_2$. As shown by $V_C$ curve (thick solid curve) in FIG. 4, when $V_{IN}$ increases from $V_L$ to $V_H$, $V_C$ tends to change along a two-dot chained curve (R=$R_2$) which is the appropriate curve when there is a CMOS circuit comprising of transistors $P_2$, $N_2$, and resistor $R_2$. However, $V_C$ in the circuit cannot rise above the base-emitter voltage $V_{BE}$ of transistor $T_2$ because $V_C$ is clamped at a level of ($V_{SS}+V_{BE}$).

On the $V_B$ and $V_C$ curves in FIG. 4, the region clamped to $V_{BE}$ from $V_{DD}$ and that clamped to $V_{BE}$ from $V_{SS}$ are ON regions of transistors $T_1$ and $T_2$, respectively, and a threshold point, where transistor $T_1$ is switched to ON from OFF, is shifted toward $V_H$ on the $V_{IN}$ axis with the increase of resistance $R_1$ and the threshold point of transistor $T_2$ is shifted toward $V_L$ with the increase of resistance $R_2$.

FIG. 4 also includes a potential transfer curve of the prior art gate circuit for comparison to the present invention. In the prior art, the gate circuit consists of one CMOS circuit and a load driving inverter and there is no resistor in the CMOS circuit, so the transfer curve is the dashed line (R=0) and the ON regions of $T_1$ and $T_2$ overlap in an overlap region $T_{ON}$ as shown at the bottom of FIG. 4 (an overlap region is shown by two dashed vertical lines in the figure).

In the present invention, because each CMOS circuit 1 and 2 includes the resistors $R_1$ and $R_2$, $V_B$ and $V_C$ have the transfer characteristics as shown by solid lines in FIG. 4. Therefore, an OFF region in which $T_1$ and $T_2$ are simultaneously OFF can be provided. Two vertical solid lines 101 and 102 show the cut-off lines of transistors $T_1$ and $T_2$ respectively and show also an OFF region of transistors $T_1$ and $T_2$, a symbol $T_{OFF}$ indicates the OFF region; the ($T_2$ ON) region and the ($T_1$ ON) region are separated because of resistors $R_1$ and $R_2$. Thus, in the present invention, the second surge current can be removed by inserting the impedance elements $R_1$ and $R_2$.

A proper amount of resistance must be provided by resistors $R_1$ and $R_2$ to remove the second surge current, however, the resistance cannot be made too large because the resistance dictates the base currents of transistors $T_1$ and $T_2$ which must be operated in a normal fashion thereby.

An output signal voltage $V_{OUT}$ produced by the gate circuits of the present invention is also shown in FIG. 4. When $V_{IN}$ is in a low voltage level state, $V_{OUT}$ is low because transistor $T_2$ is ON and transistor $T_1$ is OFF. The state where transistor $T_2$ is ON is produced by $I_{DS}$ which flows through transistor $P_2$, resistor $R_2$, and the base-emitter of transistor $T_2$. The state where transistor $T_1$ is OFF is produced by the fact that $N_1$ is OFF even though transistor $P_1$ is ON which keeps $V_B$ high enough to cut off transistor $T_1$. This state is maintained even though $V_{IN}$ increases, however, when $V_{IN}$ continues to increase, $V_C$ decreases along the two-dot curve (R=$R_2$), transistor $T_2$ is cut off, $V_B$ decreases along the one-dot curve (R=$R_1$) and transistor $T_1$ is turned ON. This switching is done as shown by a transient portion 201 of the curve which rises up along the line 101. Similarly, when $V_{IN}$ is at a high voltage level and decreases to a low voltage level, $V_{OUT}$ falls from a high voltage level to a low voltage level along a transient portion 202 of the curve along the line 102.

The complementary Bi-MOS gate circuit of the present invention can be applied as a part of a 3-state circuit and suppresses a leakage current which flows in the 3-state circuit of the prior art when the circuit operates in a high impedance state. The suppression can be accomplished by adding a suppression circuit including PMOS and NMOS transistors and an inverter to the complementary Bi-MOS gate circuit, as shown in FIGS. 5 and 6.

Figure 5:
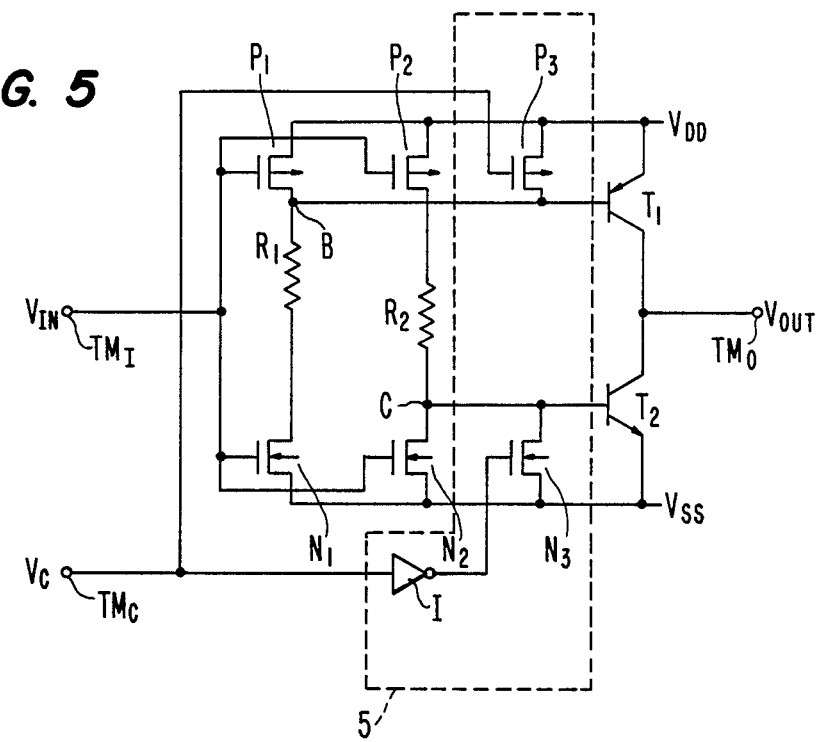
FIG. 5 is a complementary Bi-MOS gate circuit according to the present invention, the gate circuit being used as a 3-state circuit.
Figure 6:
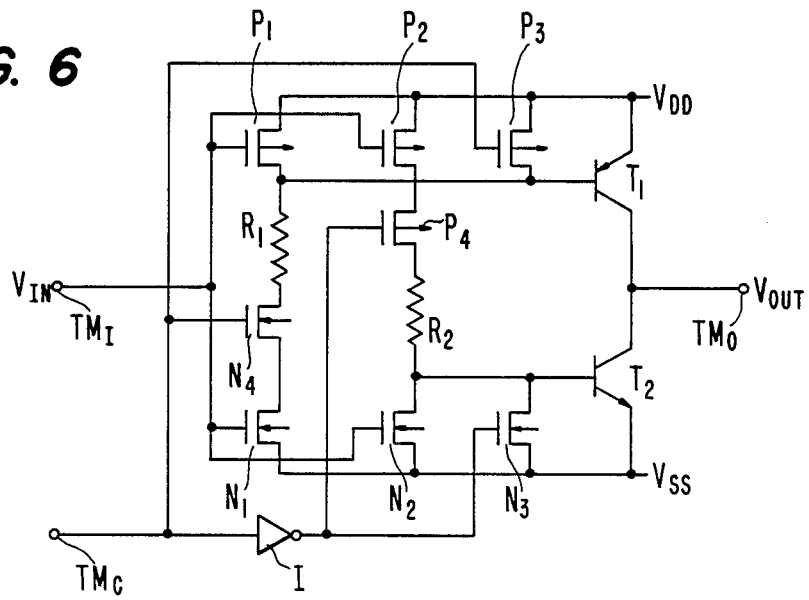
FIG. 6 is another complementary Bi-MOS gate circuit according to the present invention, the gate circuit being used as the 3-state circuit.

In FIG. 5, the parts having the same symbols and numerals as those in FIG. 1 designate the same parts of the figure. The suppression circuit 5 includes a PMOS transistor $P_3$ connected between the base of transistor $T_1$ and $V_{DD}$, an NMOS transistor $N_3$ connected between the base of transistor $T_2$ and $V_{SS}$, where the gate terminal of transistor $P_3$ is connected to a control signal terminal $TM_C$ to which an enable control signal $V_C$ is applied and where an inverted signal of $V_C$ is applied to the gate terminal of $N_3$ through an inverter I.

When $V_C$ becomes a low voltage level, both transistors $P_3$ and $N_3$ turn ON, so the base potential of transistors $T_1$ and $T_2$ become high and low voltages, respectively. Therefore, transistors $T_1$ and $T_2$ are OFF, so that the impedance seen from a load connected to a signal output terminal $TM_O$ is high. When $V_C$ is at a low voltage level and $V_{IN}$ is at a low voltage level, both transistors $P_1$ and $P_2$ are ON, so a current flows from $V_{DD}$ to $V_{SS}$ through transistor $P_2$, resistor $R_2$, and transistor $N_3$. However, the current is substantially suppressed by resistor $R_2$ so that it is possible to consider that there is no power dissipation in the gate circuit.

On the other hand, when $V_C$ is at a low voltage level and $V_{IN}$ is at a high voltage level, a current flows from $V_{DD}$ to $V_{SS}$ through transistor $P_3$, resistor $R_1$, and transistor $N_1$, however, the current can also be sufficiently suppressed by resistor $R_1$. Thus, resistors $R_1$ and $R_2$ work in the gate circuit not only to avoid turning transistors $T_1$ and $T_2$ ON but also to suppress the current dissipation when the gate circuit is used as a 3-state circuit operating in a high impedance state.

FIG. 6 shows another embodiment of the complementary Bi-MOS gate circuit of the present invention used as the 3-state circuit. In FIG. 6, the parts having the same symbols and numerals as those in FIG. 5 are the same parts as in FIG. 5. The suppression can be enhanced by adding a PMOS transistor $P_4$ between transistor $P_2$ and resistor $R_2$ and an NMOS transistor $N_4$ between transistor $N_1$ and resistor $R_1$ to the 3-state circuit of FIG. 5. The gate of transistor $P_4$ is connected to the gate of transistor $N_3$ and the gate of transistor $N_4$ is connected to $TM_C$. When $V_C$ is at a low voltage level and the 3-state circuit operates in a high impedance state, the current paths explained in FIG. 5 are cut off because $P_4$ and $N_4$ are OFF.

The many features and advantages of the invention are apparent from the detailed specification and thus it is intended by the appended claims to cover all such features and advantages of the circuit which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What I claimed is:

1. A complementary Bi-MIS gate circuit having a signal input terminal and comprising:
    a signal input terminal;
    a signal output terminal;
    a first power source outputting a first voltage;
    a second power source outputting a second voltage lower than said first voltage;
    a first CMIS circuit comprising:
        a first PMIS transistor having a source connected to said first power source, a gate connected to said signal input terminal, and a drain;
        a first NMIS transistor having a source connected to said second power source, a gate connected to said signal input terminal, and a drain; and
        a first impedance element connected between the drain of said first PMIS transistor and the drain of said first NMIS transistor and forming a first connection point between the drain of said first PMIS transistor and said first impedance element;
    a second CMIS circuit comprising:
        a second PMIS transistor having a source connected to said first power source, a gate connected to said signal input terminal, and a drain;
        a second NMIS transistor having a source connected to said second power source, a gate connected to said signal input terminal, and a drain; and
        a second impedance element connected between the drain of said second PMIS transistor and the drain of said second NMIS transistor and forming a second connection point between the drain of said second NMIS transistor and said second impedance element; and
    a load driving inverter comprising:
        a vertically structured common emitter type pull-up bipolar transistor having a base connected to the first connection point, an emitter connected to said first power source, and a collector connected to said signal output terminal; and
        a vertically structured common emitter type pull-down bipolar transistor having a base connected to the second connection point, an emitter connected to said second power source, and a collector connected to said signal output terminal.

2. A circuit as recited in claim 1, further comprising:
    a third PMIS transistor connected between the base of said pull-up bipolar transistor and the first power source, and having a gate;
    a third NMIS transistor connected between the base of said pull-down bipolar transistor and the second power source, and having a gate;
    means for applying an enable signal to the gate of said third PMIS transistor; and
    means for applying an inverted enable signal to the gate of said third NMIS transistor.

3. A circuit as recited in claim 2, further comprising:
    a fourth PMIS transistor connected between said second PMIS transistor and said second impedance element, and having a gate;
    a fourth NMIS transistor connected between said first NMIS transistor and said first impedance element, and having a gate;
    means for applying an inverted enable signal to the gate of said fourth PMIS transistor; and
    means for applying the enable signal to the gate of said fourth NMIS transistor.

4. A circuit as recited in claim 3, wherein each PMIS transistor comprises a PMOS transistor and each NMIS transistor comprises a NMOS transistor.

5. A circuit as recited in claim 3, wherein each impedance element comprises a resistor.

6. A circuit as recited in claim 3, wherein said PMIS transistor comprises a PMOS transistor, said NMIS transistor comprises an NMOS transistor, and said impedance element comprises a resistor.

* * * * *